United States Patent
Chen et al.

(10) Patent No.: US 10,298,822 B1
(45) Date of Patent: May 21, 2019

(54) IMAGE CAPTURING DEVICE AND METHOD OF MANUFACTURING THE SAME

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Wei-Jie Chen, Guangdong (CN); Shang-Yu Huang, Guangdong (CN)

(73) Assignees: INTERFACE TECHNOLOGY (CHENGDU) CO., LTD., Sichuan (CN); INTERFACE OPTOELECTRONICS (SHENZHEN) CO., LTD., Guangdong (CN); GENERAL INTERFACE SOLUTION LIMITED, Miaoli County (TW)

( * ) Notice: Subject to any disclaimer, the term of this patent is extended or adjusted under 35 U.S.C. 154(b) by 0 days.

(21) Appl. No.: 15/940,995

(22) Filed: Mar. 30, 2018

(30) Foreign Application Priority Data

Feb. 7, 2018  (CN) .......................... 2018 1 0123860

(51) Int. Cl.
   G02F 1/1333     (2006.01)
   H04N 5/225      (2006.01)
   G02B 5/20       (2006.01)

(52) U.S. Cl.
   CPC ............ H04N 5/2254 (2013.01); G02B 5/20 (2013.01); H04N 5/2253 (2013.01)

(58) Field of Classification Search
   CPC ............. G02F 1/133512; G02F 1/1339; G06F 1/1686; G06F 3/041–047; H04N 5/2251; H04N 5/2257
   See application file for complete search history.

(56) References Cited

U.S. PATENT DOCUMENTS

2012/0206669 A1* 8/2012 Kim ...................... G06F 1/1686
                                                      349/58
2017/0068287 A1* 3/2017 Jung ..................... G06F 1/1686

* cited by examiner

Primary Examiner — Sinh Tran
Assistant Examiner — Selam T Gebriel
(74) Attorney, Agent, or Firm — CKC & Partners Co., LLC

(57) ABSTRACT

An image capturing device includes a substrate, a black matrix layer, an anti-reflection layer, a counter substrate, a sealant, a plurality of spacers and a photo-sensitive component. The black matrix layer is disposed on the substrate. The black matrix layer has a via exposing a portion of the substrate. The anti-reflection layer covers the via of the black matrix layer. The counter substrate is disposed opposite to the substrate. The counter substrate has an opening, and a orthographic projection of the opening onto the black matrix layer is overlapped with the anti-reflection layer and a portion of the black matrix layer surrounding the via. The sealant is disposed between the counter substrate and the substrate. The spacers are disposed over the portion of the black matrix layer surrounding the via. The photo-sensitive component is disposed at the opening of the counter substrate.

9 Claims, 10 Drawing Sheets

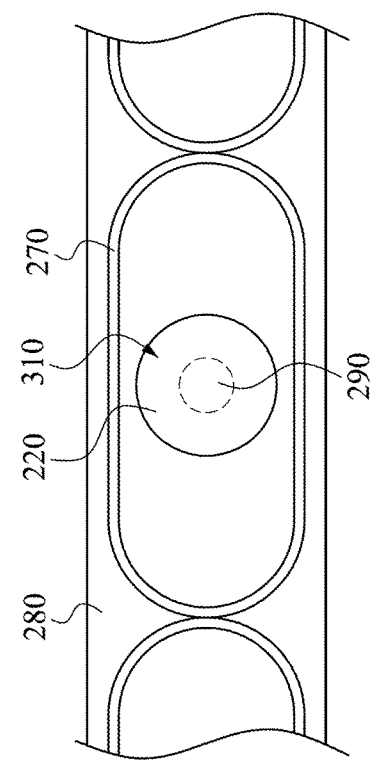
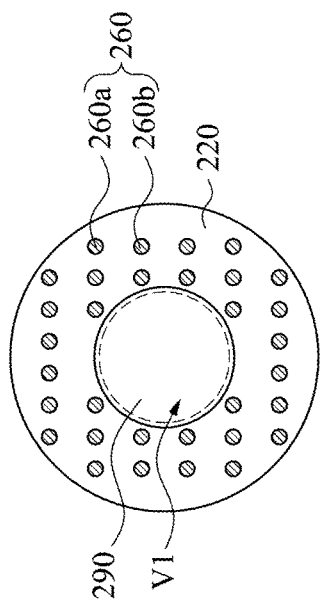
Fig. 12A
Fig. 12B

IMAGE CAPTURING DEVICE AND METHOD OF MANUFACTURING THE SAME

CROSS-REFERENCE TO RELATED APPLICATION

This application claims priority to Chinese Application Serial Number 201810123860.2, filed Feb. 7, 2018, which is herein incorporated by reference.

BACKGROUND

Field of Invention

The present invention relates to an image capturing device. More particularly, the present invention relates to an image capturing device having spacers.

Description of Related Art

All electronic devices are trending toward a compact, thin and lightweight design along with the evolving electronics industry. Therefore, some daily-use electronic products, such as smartphones and laptops are normally combined with other electronic products in order to be handier. For example, some electronic products are often combined with an image capturing device.

In the making of an opening for accommodating a photographic lens of an image capturing device, a portion of a thin-film-transistor substrate (i.e., active matrix substrate) is removed to form the opening for a photographic lens. The removed portion may fall off and scrape the underlying color filter or black matrix layer, thereby influencing the image capturing quality. Thus, there is a call for a new structure for the image capturing device and manufacturing method thereof to address the abovementioned issue.

SUMMARY

According to various embodiments of the present disclosure, an image capturing device is provided. The method includes a substrate, a black matrix layer, an anti-reflection layer, a counter substrate, a sealant, a spacer, and a photo-sensitive component. The black matrix layer is disposed on the substrate and having a via exposing a portion of the substrate. The anti-reflection layer covers the via of the black matrix layer. The counter substrate is opposite to the substrate and having an opening. An orthographic projection of the opening onto the black matrix layer is overlapped with the anti-reflection layer and a portion of the black matrix layer surrounding the via. A sealant is disposed between the counter substrate and the substrate. A plurality of spacers are disposed over the portion of black matrix layer surrounding the via. A photo-sensitive component is disposed at the opening of the counter substrate.

In some examples, the image capturing device further includes a pattern layer. The pattern layer is disposed on the black matrix layer. The pattern layer has a top surface and a plurality of recesses, and the spacers are disposed on the top surface and in the recesses.

In some examples, the pattern layer includes a patterned color resist layer and a protective layer. The patterned color resist layer is disposed on the black matrix layer. The protective layer covers the patterned color resist layer and the black matrix layer.

In some examples, the spacers include a plurality of first spacers and a plurality of second spacers. The first spacers are disposed on the top surface. The second spacers are disposed in the recesses. A height difference between a top surface of the first spacers and a top surface of the second spacers ranges from of 0.5 μm to 3.5 μm.

In some examples, the spacers are columnar.

According to various embodiments of the present disclosure, a method of manufacturing an image capturing device is provided. The method includes forming a black matrix layer on a substrate. The black matrix layer includes a via exposing the substrate and an edge portion surrounding the via. Forming a plurality of spacers over the edge portion of the black matrix layer surrounding the via. Forming a sealant over the black matrix layer and surrounding the spacers. Disposing a counter substrate on the sealant, while the counter substrate is opposite to the substrate. Removing a portion of the counter substrate to form an opening. Forming an anti-reflection layer covering the via of the black matrix layer. The anti-reflection layer and a portion of the black matrix layer surrounding the via are within an orthographic projection of the opening of the counter substrate onto the black matrix layer. Forming a photo-sensitive component at the opening of the counter substrate.

In some examples, before forming the spacers, further includes forming a pattern layer on the black matrix layer, the pattern layer has a top surface and a plurality of recesses, in which the spacers are disposed on the top surface and in the recesses.

In some examples, the step of forming the pattern layer includes forming a patterned color resist layer on the black matrix layer. Forming a protective layer covering the patterned color resist layer and the black matrix layer.

In some examples, the step of forming the spacers includes forming a photoresist layer over the black matrix layer. Patterning the photoresist layer to form the spacers.

Some preferred examples are described in detail below with accompanying drawings to clarify the context above and other purposes, features and advantages of the present disclosure.

BRIEF DESCRIPTION OF THE DRAWINGS

The invention can be more fully understood by reading the following detailed description of the embodiment, with reference made to the accompanying drawings as follows:

FIG. 12A illustrates a schematic top view of the image capturing device according to some embodiments of the present invention.

FIG. 12B is an enlarged schematic view below the photo-sensitive component of the image capturing device, according to some embodiments of the present disclosure.

DETAILED DESCRIPTION

Figure 1:
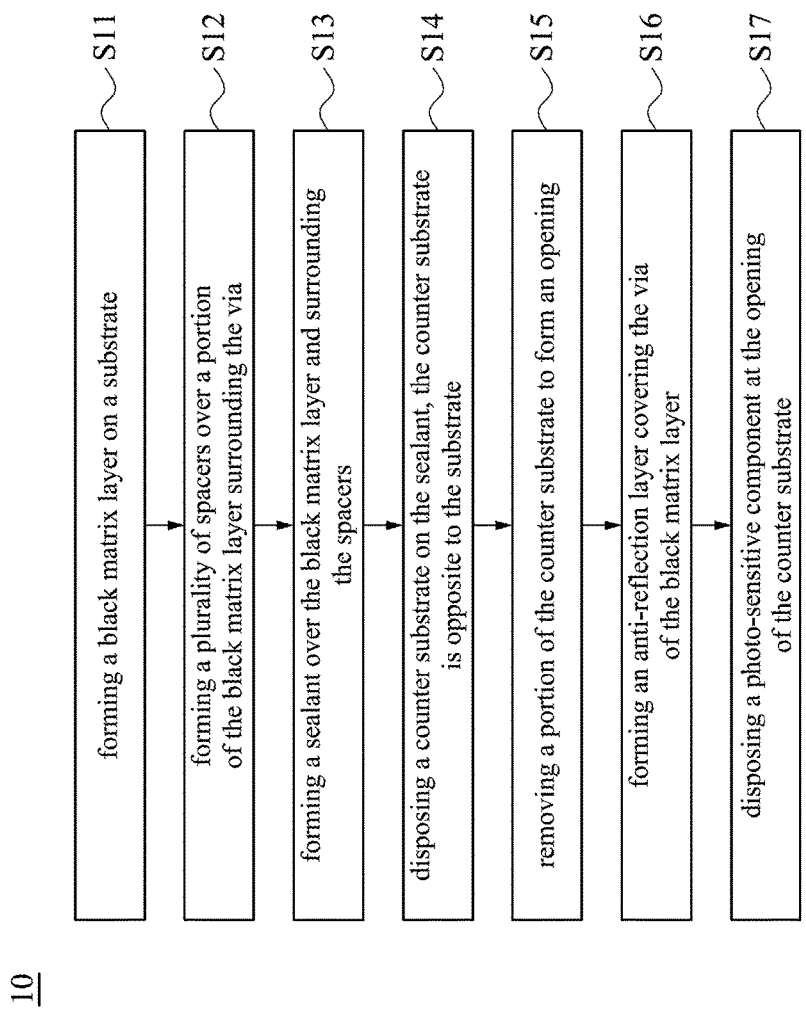
FIG. 1 is a flowchart of a manufacturing method of an image capturing device according to some embodiments.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. However, it should be understood that these details of practice do not intend to limit the present disclosure. That is, these details of practice are not necessary in parts of embodiments of the present invention. The use of embodiments or examples anywhere in this specification is illustrative, and in no way limits the scope and meaning of the invention or of any exemplified term.

In the present disclosure, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terminology used herein is for the purpose of describing particular embodiments only and is not intended to be limiting of the invention. As used herein, the singular forms "a," "an," and "the" are intended to include the plural forms as well, unless the context clearly indicates otherwise.

Various examples of the image capturing device and the manufacturing thereof are provided below, in which the structure and the properties of the image capturing device are described in detail, along with the manufacturing steps of the image capturing device.

FIG. 1 is a flowchart illustrating a manufacturing method 10 of an image capturing device, according to some embodiments. As shown in FIG. 1, the method 10 includes step S11, step S12, step S13, step S14, step S15, step 16, and step S17. It is understood that additional step may be provided before, during or after the method 10, and some steps described below may be replaced or eliminated as an additional embodiment of the manufacturing method.

Figure 2:
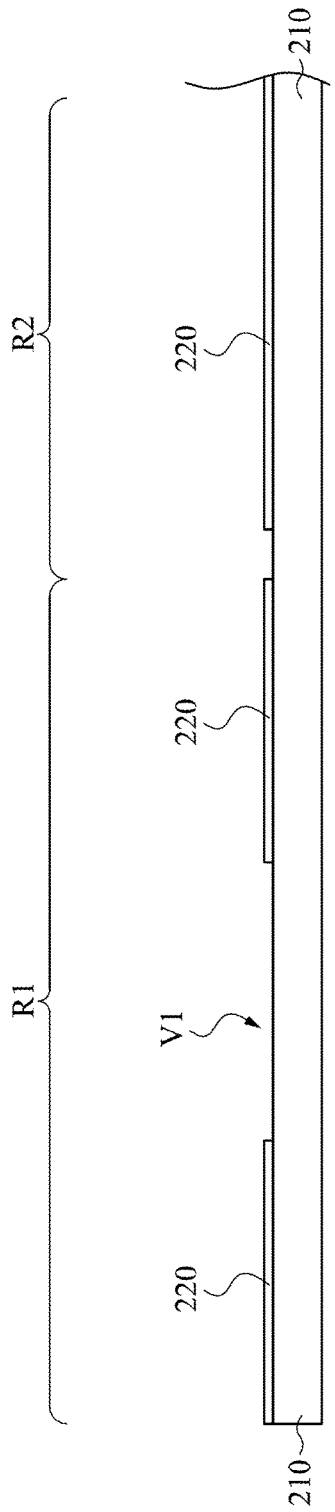
FIG. 2 to FIG. 11 illustrates schematic sectional views of various manufacturing stages of the image capturing device, according to some embodiments of the present invention.

FIG. 2 to FIG. 10 illustrates schematic sectional views of various manufacturing stages of the image capturing device, according to some embodiments of the present invention. Referring to FIG. 1 and FIG. 2, the method 10 begins at step S11, in which a black matrix layer is formed on a substrate. As shown in FIG. 2, according to some embodiments of the present invention, a substrate 210 includes a peripheral region R1 and a display region R2, and the peripheral region R1 surrounds the display region R2. For clarity, the peripheral region R1 and the display region R2 are partially illustrated. The black matrix layer 220 is formed on the substrate 210. The black matrix layer 220 in the peripheral region R1 of the substrate 210 includes a via V1 and an edge portion, and the via V1 is surrounded by the edge portion of the black matrix layer 220. The via V1 exposes a portion of the substrate 210. In one embodiment, a plurality of openings are formed in the black matrix layer 220 in the display region R2 of the substrate 210 by a lithography process. To be more specific, a color resist layer may be formed in the openings described above in a later process, with details provided below. It is understood that the black matrix layer 220 in the display region R2 of the substrate 210 and the black matrix layer 220 in the peripheral region R1 of the substrate 210 may beformed simultaneously in the same manufacturing step.

Figure 3:
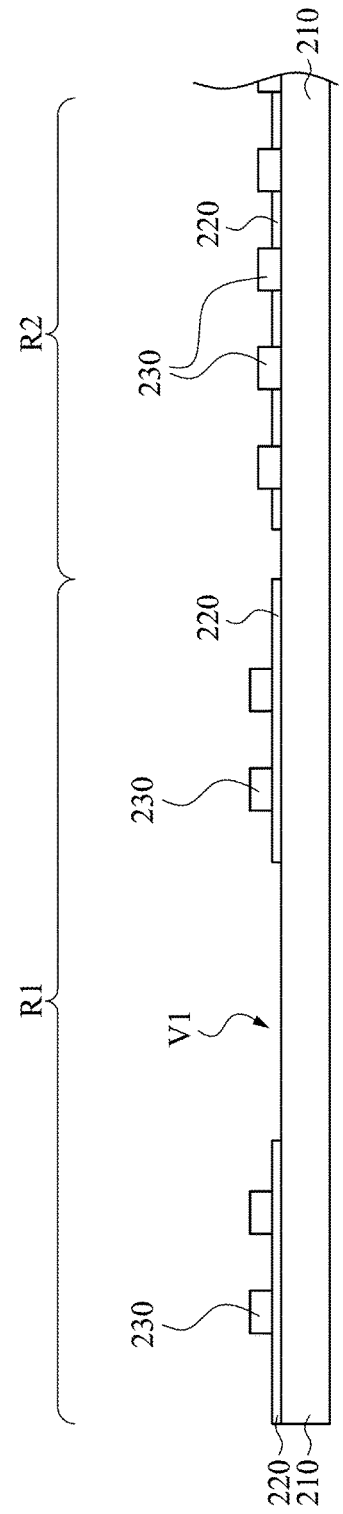

As shown in FIG. 3, in some embodiments, after the black matrix layer 220 is formed, a patterned color resist layer 230 may be optionally formed on the black matrix layer 220. In one example, the patterned color resist layer 230 is formed over the peripheral region R1 and the display region R2 of the substrate 210. Specifically, the patterned color resist layer 230 in the display region R2 may be formed into a color resist layer with different colors by multiple lithography and curing processes. For example, the patterned color resist layer 230 in the display region R2 may include different color resist layers with red, green, or blue color. It is understood that the patterned color resist layer 230 in the peripheral region R1 and the patterned color resist layer 230 in the display region R2 may be simultaneously formed.

Figure 4:
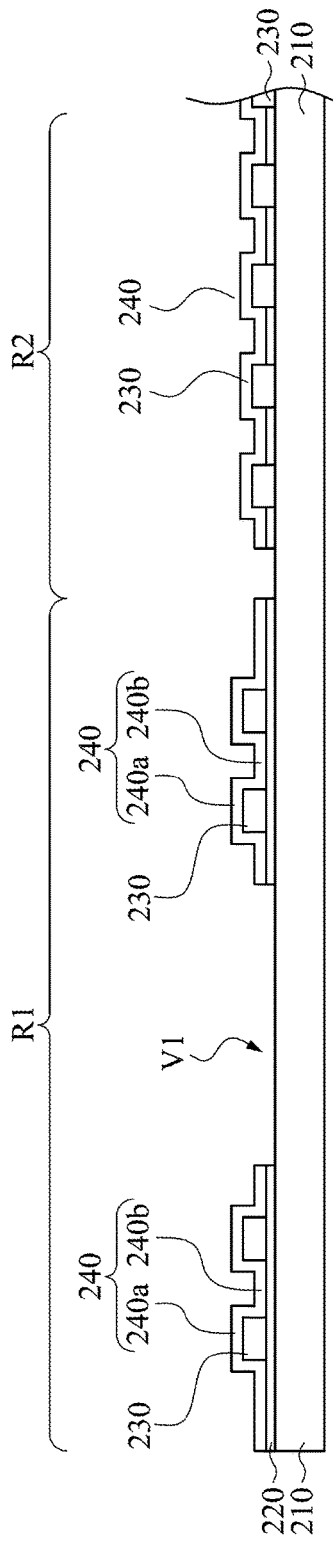

As shown in FIG. 4, in some embodiments, after the patterned color resist layer 230 is formed, a protective layer 240 may be optionally formed conformally covering the patterned color resist layer 230 and the black matrix layer 220. In one example, the protective layer 240 is formed over the peripheral region R1 and the display region R2 of the substrate 210. The protective layer 240 is used primarily for protecting the patterned color resist layer 230. In another example, the protective layer 240 includes an epoxy resin layer, an acrylic resin layer, or other suitable material layers. In yet another example, the protective layer 240 has a top surface 240a and a plurality of recesses 240b because the protective layer 240 conformally covers the patterned color resist layer 230 and the black matrix layer 220.

Figure 5:
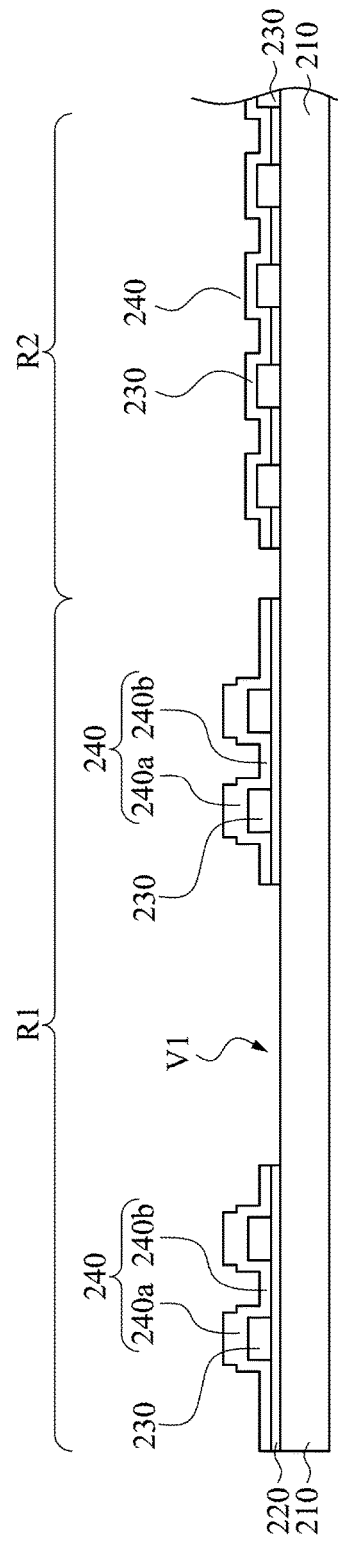

As shown in FIG. 5, in other embodiments, after the patterned color resist layer 230 is formed, a protective layer 240 having a particular outer profile may be optionally formed in the peripheral region R1 to cover the patterned color resist layer 230 and the black matrix layer 220. In one example, the protective layer 240 having the particular outer profile is shaped by a mold having the particular outer profile. Specifically, compared with the protective layer 240 illustrated in FIG. 4, the protective layer 240 having the particular outer profile has a higher top surface 240a, and the protective layer 240 having the particular outer profile has a stepped-shape in a sectional view. The protective layer 240 having the particular outer profile has a specific technical effect, with details provided below.

Figure 6:
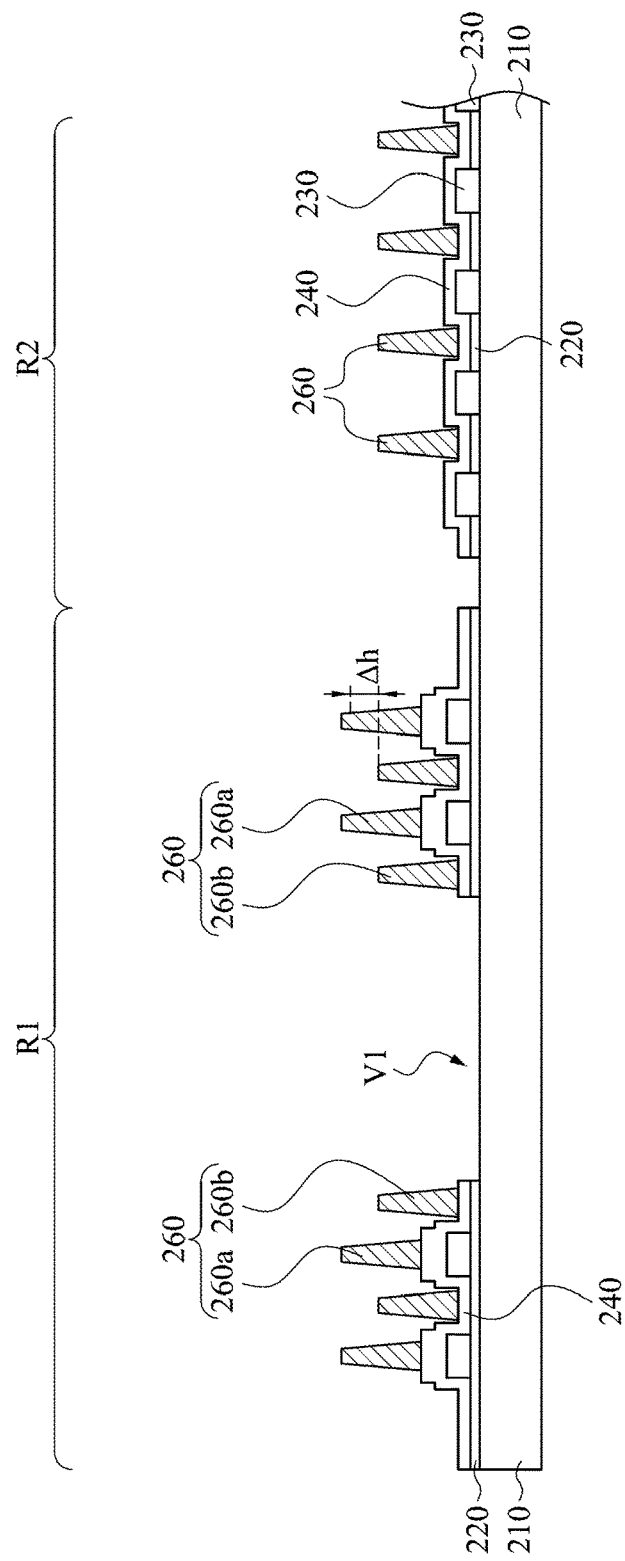

Please refer to FIG. 1 and FIG. 6, the method 10 proceeds to step S12, in which a plurality of spacers are formed on the portion of the black matrix layer surrounding the via. As shown in FIG. 6, in some embodiments, the spacers (photo spacers) 260 are formed over the edge portion of the black matrix layer 220 surrounding the via V1 in the peripheral region R1. The spacers 260 may have a columnar shape, for example. In one example, in the peripheral region R1, the patterned color resist layer 230 and/or the protective layer 240 may be omitted, and the spacers 260 are directly formed on the portion of the black matrix layer 220 surrounding the via V1. In another example, the spacers 260 in the peripheral region R1 include a plurality of spacers 260a and a plurality of spacers 260b. The spacers 260a are disposed on the top surface 240a of the protective layer 240, while the spacers 260b are disposed in the recesses 240b of the protective layer 240. For example, since the spacers 260a are disposed on the top surface 240a of the protective layer 240 having the particular outer profile, a height difference $\Delta h$ between the top of the spacer 260a and the top of the spacer 260b may be increased. The height difference $\Delta h$ has a specific technical effect, which is described in detail below. The height difference $\Delta h$ may be 0.5 µm to 3.5 µm, such as 0.8 µm, 1.0 µm, 1.3 µm, 1.5 µm, 1.8 µm, 2 µm, 2.3 µm, 2.5 µm, 2.8 µm, 3 µm, or 3.3 µm. It is understood that the spacers 260 may be formed over the black matrix layer 220 in the display region R2 during step S12. Specifically, the spacers 260 in the display region R2 are formed on the protective layer 240. In one example, in the display region R2, the protective layer 240 may be omitted, and the spacers 260 may be directly formed on the black matrix layer 220. In yet another example, the step of forming the spacers 260 includes forming a photosensitive material layer over the protective layer 240, and the photosensitive material layer is patterned by a patterning process to form the spacers 260. For example, the spacers 260 are formed over the peripheral region R1 and the display region R2 of the substrate 210 simultaneously.

Figure 7:
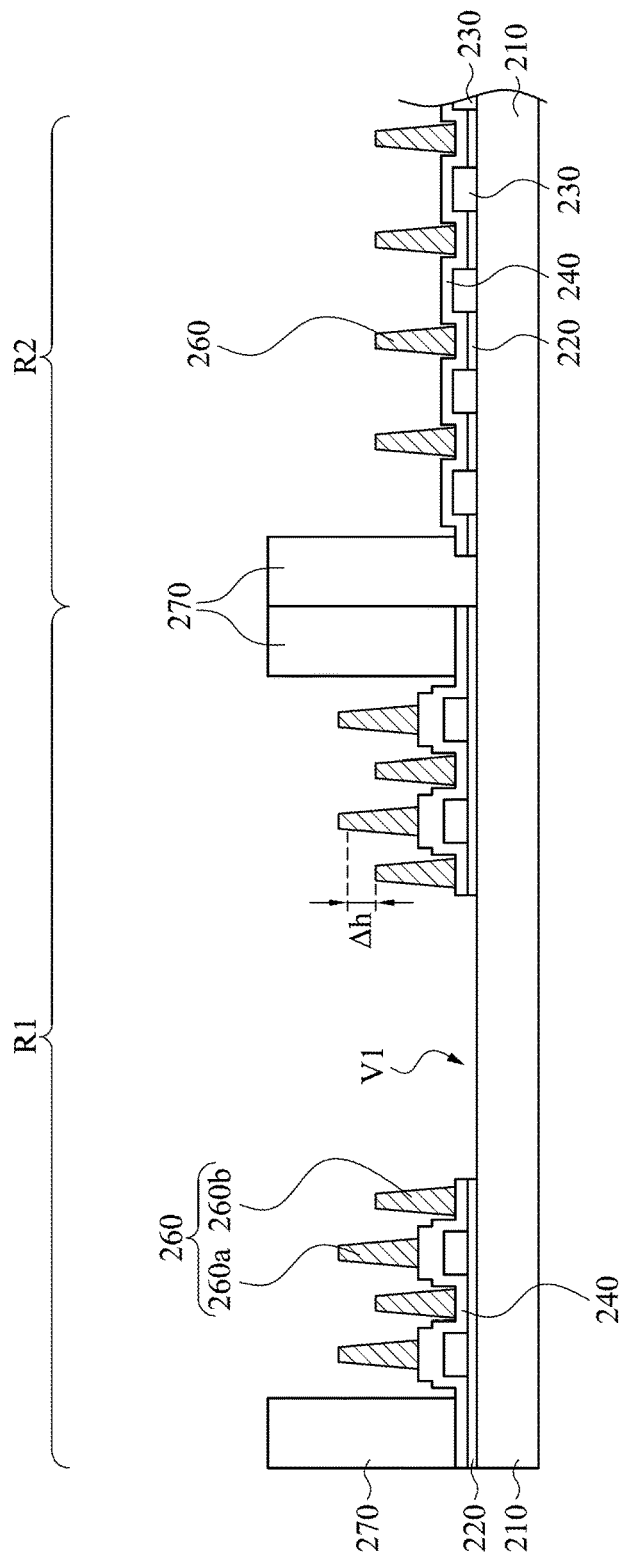

Please refer to FIG. 1 and FIG. 7, the method 10 proceeds to step S13. A sealant is formed over the black matrix layer and surrounds the spacers. As shown in FIG. 7, in some embodiments, a sealant 270 is formed in the peripheral region R1 and formed on the protective layer 240, while the sealant 270 surrounds the spacers 260. In an embodiment where the patterned color resist layer 230 and/or the protective layer 240 are omitted in the peripheral region R1, the sealant 270 is directly formed on the black matrix layer 220. In some embodiments, in the display region R2, the sealant 270 is formed on the protective layer 240 and a portion of the substrate. In some embodiment where the protective layer 240 is omitted in the display region R2, the sealant 270 is directly formed on the black matrix layer 220 and a portion of the substrate. In one example, the sealant 270 is used to bond the formed color filter substrate with an active array substrate.

Figure 8:
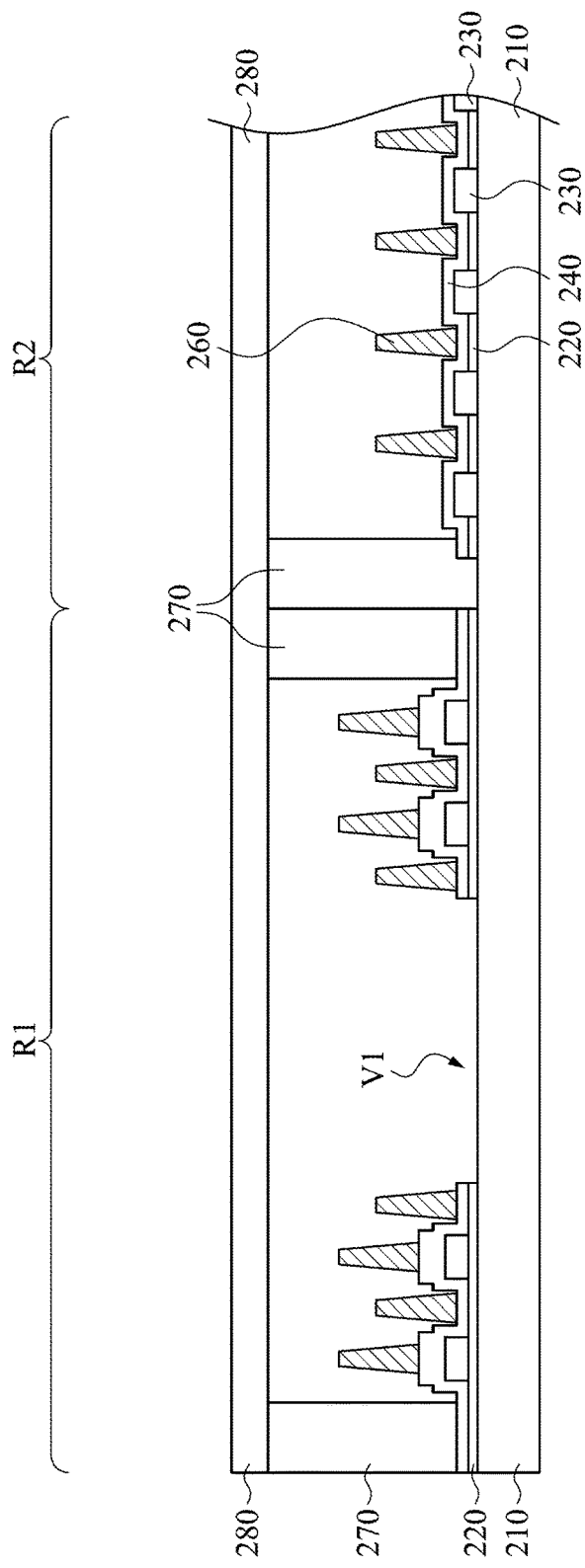

Please refer to FIG. 1 and FIG. 8. The method 10 proceeds to step S14. A counter substrate (such as an active array substrate) is disposed on the sealant, and the counter substrate is opposite to the substrate. As shown in FIG. 8, in some embodiments, the counter substrate 280 is disposed on the sealant 270 and aligned with the substrate 210; thus the counter substrate 280 has a peripheral region R1 and a display region R2 corresponding to the substrate 210. In one example, the counter substrate 280 includes a plurality of thin film transistors (TFT) and a plurality of pixel electrodes in the display region R2.

Figure 9:
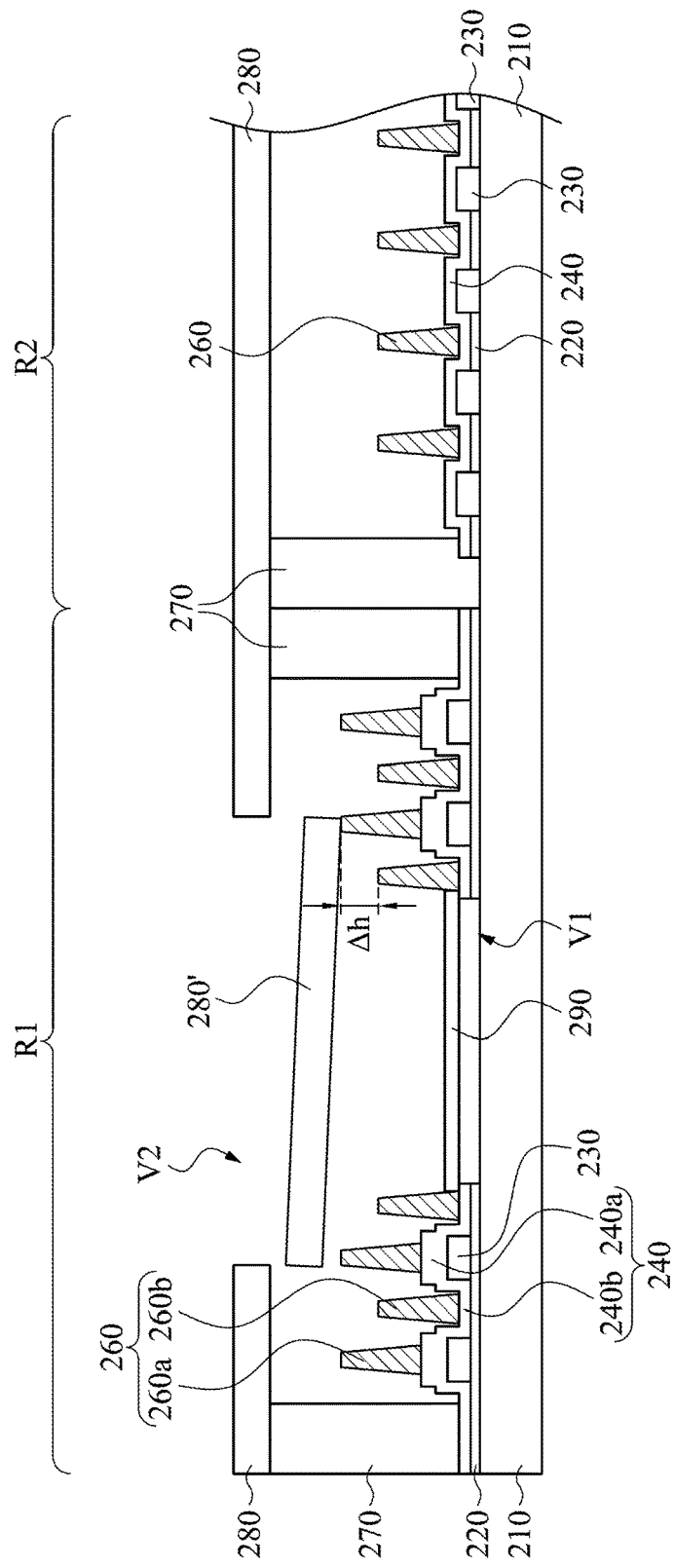

Please refer to FIG. 1 and FIG. 9. The method 10 proceeds to step S15. A portion of the counter substrate is removed to form an opening. As shown in FIG. 9, in some embodiments, in the peripheral region R1, a portion of the counter substrate 280 is removed to form an opening V2. Specifically speaking, the opening V2 of the counter substrate 280 has an orthographic projection onto the black matrix layer 220, and the anti-reflection layer and a portion of the black matrix layer surrounding the via are within (e.g., overlapped with) the orthographic projection. In short, the opening V2 is substantially aligned with the via V1 of the black matrix layer 220, and the area of the opening V2 is greater than the area of the via V1 of the black matrix layer 220. The opening V2 is used to accommodate a photo-sensitive component (such as an image capturing component) in a later step. It is noted that when the portion of the counter substrate 280 is being removed to form the opening, the removed portion 280' of the counter substrate 280 may fall off onto the substrate 210 and/or the black matrix layer 220. Therefore, the surface of the substrate 210 and/or the black matrix layer 220 may be scrapped, causing light-leaking and lowering the photograph and video quality of the image capturing component. When the removed portion 280' of the counter substrate 280 falls off, the spacers 260 may directly block off the removed portion 280' of the counter substrate 280. Accordingly, any direct contact between the removed portion 280' with the substrate 210 and/or the black matrix layer 220 is prevented, and the surface of the substrate 210 and/or the black matrix layer 220 may be protected. In addition, the height difference Δh between the spacer 260a and the spacer 260b may further provide a supporting force for buffering. The protective layer 240 having particular outer profile may increase the height difference Δh and enhance the buffering.

It is understood that not all of the advantages are discussed herein. All of the embodiments or examples need no particular advantages, and different advantages may be provided by other embodiments or examples.

Figure 10:
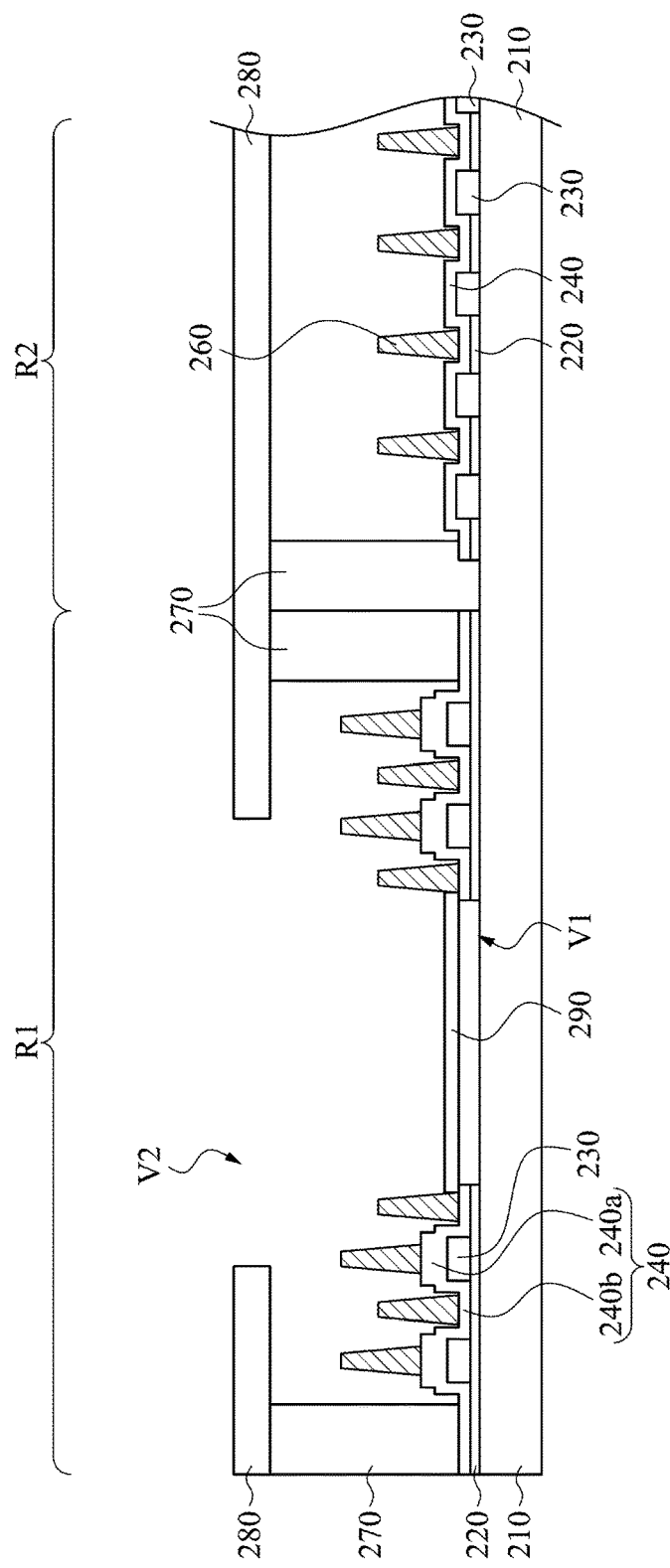

Please refer to FIG. 1 and FIG. 10. The method 10 proceeds to step S16. An anti-reflection layer is formed covering the via of the black matrix layer. As shown in FIG. 10, in some embodiments, the removed portion 280' of the counter substrate 280 described in preceding step is removed first. Next, an anti-reflection layer 290 is formed covering the via V1 of the black matrix layer 220. In one example, a portion of the anti-reflection layer 290 is disposed over the black matrix layer 220. A spacing interval is present between the anti-reflection layer 290 and the substrate 210, thereby the anti-reflection layer 290 and the substrate 210 are not in direct contact.

Figure 11:
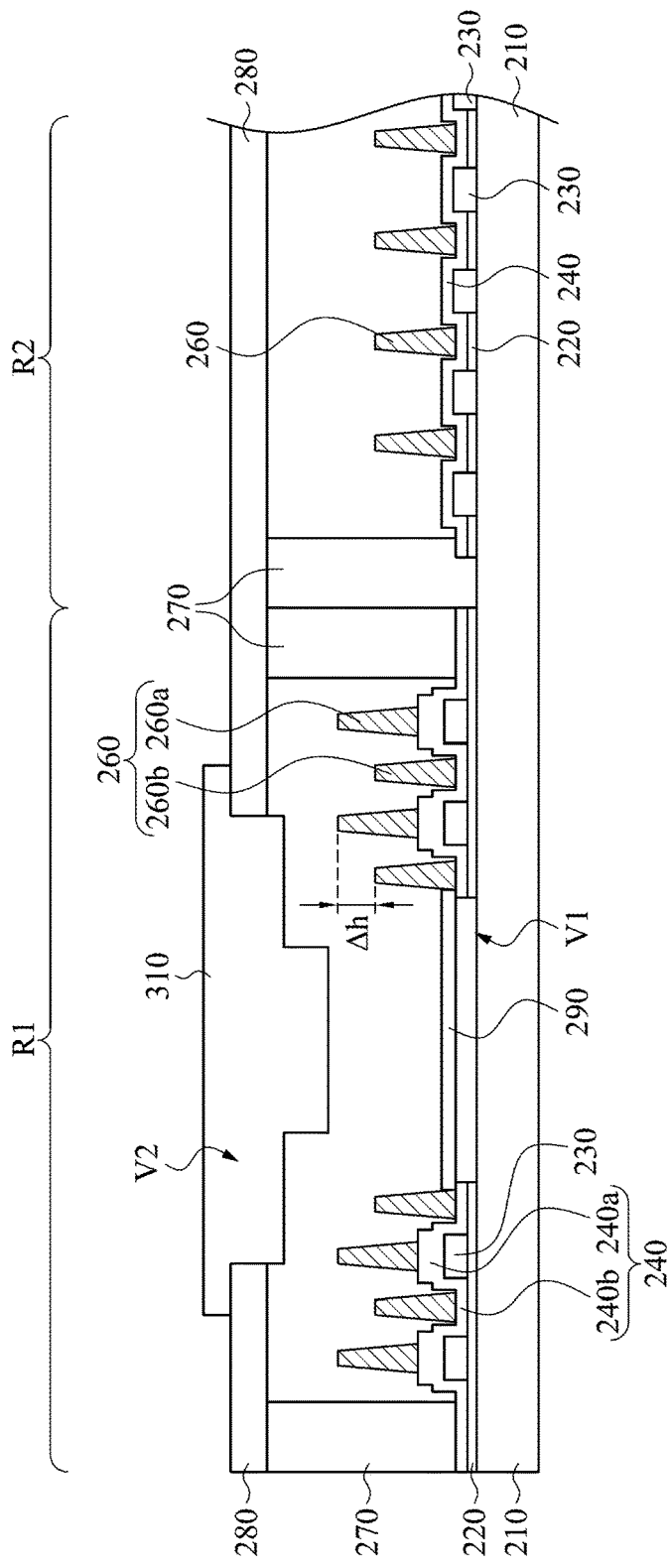

Please refer to FIG. 1 and FIG. 11. The method 10 proceeds to step S17. A photo-sensitive component is disposed at the opening of the counter substrate. As shown in FIG. 11, in some embodiments, a photo-sensitive component 310 is disposed at the opening V2 of the counter substrate 280. In one example, the photo-sensitive component 310 may be such as an image capturing component having a lens and an image sensor. The lens may be a lens assembly containing one or more optical glass, and the optical glass may be such as a concave lens, a convex lens, an aspherical lens, or combinations thereof.

FIG. 12A is a schematic top view of the image capturing device according to some embodiments of the present disclosure. As shown in FIG. 12A, an image capturing component is disposed in the peripheral region R1. The sealant 270 is disposed around the photo-sensitive component 310, and is bonded to the counter substrate 280. The photo-sensitive component 310 covers the underlying anti-reflection layer 290 and a portion of the black matrix layer 220. The dashed region as shown in FIG. 12B illustrates the via V1 covered by the photo-sensitive component 310, in which FIG. 12B is an enlarged plane view schematically illustrating the structures below the photo-sensitive component of the image capturing device according to some embodiments of the present disclosure. As shown in FIG. 12B, the black matrix layer 220 has the via V1, and a plurality of spacers 260 are disposed over the black matrix layer 220 and surrounds an anti-reflection layer 290. In some embodiments, the spacers 260 include a plurality of spacers 260a and a plurality of spacers 260b. In one example, the spacers 260a and the spacers 260b are alternately disposed over the black matrix layer 220. As shown in the dashed region in FIG. 12B, the anti-reflection layer 290 covers the via V1 and a portion of the black matrix layer 220 surrounding the via V1.

According to another aspect of the present invention, an image capturing device is provided. Referring to FIG. 11, the image capturing device includes a substrate 210, a black matrix layer 220, an anti-reflection layer 290, a counter substrate 280, a sealant 270, a plurality of spacers 260, and a photo-sensitive component 310. The black matrix layer 220 is disposed on the substrate 210. The black matrix layer 220 has a via V1 exposing a portion of the substrate 210. The anti-reflection layer 290 covers the via V1 of the black matrix layer 220. The counter substrate 280 is opposite to the substrate 210. The counter substrate 280 has an opening V2, and an orthographic projection of the opening V2 onto the black matrix layer 220 is overlapped with the anti-reflection layer 290 and a portion of the black matrix layer 220 surrounding the via V1. The sealant 270 is disposed between the counter substrate 280 and the substrate 210. The spacers 260 are disposed over the portion of the black matrix layer 220 surrounding the via V1. In one example, the spacers are columnar. In another example, the spacers 260 level with each other, i.e., each of the spacers 260 has the same height.

In some embodiments, the image capturing device may further include a pattern layer disposed on the black matrix layer 220. The pattern layer includes a patterned color resist layer 230 and/or a protective layer 240. Specifically speaking, the patterned color resist layer 230 is disposed on the black matrix layer 220. The protective layer 240 covers the patterned color resist layer 230 and the black matrix layer 220, and thereby the protective layer 240 has a rugged profile comprised of the top surfaces 240a and recesses 240b. Therefore, it is understood that the pattern layer has a rugged profile comprised of top surfaces and recesses as well, and the spacers 260 are disposed on the top surfaces and in the recesses. In one example, the spacers 260 include a plurality of spacers 260a and a plurality of spacers 260b, in which the spacers 260a are disposed on the top surfaces of the pattern layer, whereas the spacers 260b are disposed in the recesses. It is noted that a height difference Δh between a top surface of the spacer 260a and a top surface of the spacer 260b ranges from 0.5 μm to 3.5 μm, such as 0.8 μm, 1.0 μm, 1.3 μm, 1.5 μm, 1.8 μm, 2 μm, 2.3 μm, 2.5 μm, 2.8 μm, 3 μm, or 3.3 μm. In detail, the height difference Δh may further enhance the buffering against the removed portion that falls off in a later drilling step. Thus the surface of the substrate 210 and/or the black matrix layer 220 is protected from being damaged directly by the removed portion. The photo-sensitive component 310 is disposed at the opening V2 of the counter substrate 280.

In summary, the various embodiments provided in the present disclosure may prevent scraping on the surface of the substrate and/or the black matrix layer to maintain the photograph and video quality of the image capturing device. In addition, the various embodiments provided in the present disclosure are compatible with the conventional display panel manufacturing process. The color resist layers and the spacers in the display region are further extended to or arranged on the peripheral region, so that the surface of the substrate and black matrix layer there under in the peripheral region are well protected.

The foregoing has outlined features of several embodiments so that those skilled in the art can better understand the detailed description that follows. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions and alterations herein without departing from the spirit and scope of the present disclosure.

What is claimed is:

1. An image capturing device, comprising:
   a substrate;
   a black matrix layer disposed on the substrate, the black matrix layer having a via exposing a portion of the substrate;
   an anti-reflection layer covering the via of the black matrix layer;
   a counter substrate opposite to the substrate, the counter substrate having an opening, wherein an orthographic projection of the opening onto the black matrix layer is overlapped with the anti-reflection layer and a portion of the black matrix layer surrounding the via;
   a sealant disposed between the counter substrate and the substrate;
   a plurality of spacers disposed over the portion of the black matrix layer surrounding the via; and
   a photo-sensitive component disposed at the opening of the counter substrate.

2. The image capturing device of claim 1, further comprising a pattern layer disposed on the black matrix layer, wherein the pattern layer has a top surface and a plurality of recesses, and the spacers are disposed on the top surface and in the recesses.

3. The image capturing device of claim 2, wherein the pattern layer comprises:
   a patterned color resist layer disposed on the black matrix layer; and
   a protective layer covering the patterned color resist layer and the black matrix layer.

4. The image capturing device of claim 2, wherein the spacers comprise a plurality of first spacers and a plurality of second spacers, the first spacers are disposed on the top surface, the second spacers are disposed in the recesses, and a height difference between a top surface of the first spacers and a top surface of the second spacers ranges from 0.5 μm to 3.5 μm.

5. The image capturing device of claim 1, wherein the spacers are columnar.

6. A method of manufacturing an image capturing device, comprising:
   forming a black matrix layer on a substrate, the black matrix layer comprising a via and an edge portion surrounding the via, and the via exposing the substrate;
   forming a plurality of spacers over the edge portion of the black matrix layer surrounding the via;
   forming a sealant over the black matrix layer and surrounding the spacers;
   disposing a counter substrate on the sealant, wherein the counter substrate is opposite to the substrate;
   removing a portion of the counter substrate to form an opening;
   forming an anti-reflection layer covering the via of the black matrix layer, wherein the anti-reflection layer and a portion of the black matrix layer surrounding the via are within an orthographic projection of the opening of the counter substrate onto the black matrix layer; and
   disposing a photo-sensitive component at the opening of the counter substrate.

7. The method of claim 6, before forming the spacers, further comprising forming a pattern layer on the black matrix layer, wherein the pattern layer has a top surface and a plurality of recesses, and the spacers are disposed on the top surface and in the recesses.

8. The method of claim 7, wherein the step of forming the pattern layer comprises:
   forming a patterned color resist layer on the black matrix layer; and
   forming a protective layer covering the patterned color resist layer and the black matrix layer.

9. The method of claim 6, wherein the step of forming the spacers comprises:
   forming a photoresist layer over the black matrix layer; and
   patterning the photoresist layers to form the spacers.

* * * * *